United States Patent
Gaboriau et al.

(10) Patent No.: US 7,570,118 B1
(45) Date of Patent: Aug. 4, 2009

(54) THERMAL OVERLOAD PROTECTION CIRCUIT AND METHOD FOR PROTECTING SWITCHING POWER AMPLIFIER CIRCUITS

(75) Inventors: Johann Gaboriau, Austin, TX (US); Lingli Zhang, Austin, TX (US); Randy Boudreaux, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 84 days.

(21) Appl. No.: 11/862,338

(22) Filed: Sep. 27, 2007

(51) Int. Cl.
  *H03F 1/52* (2006.01)
(52) U.S. Cl. .................. 330/298; 330/10; 330/251
(58) Field of Classification Search .......... 330/10, 330/207 P, 251, 289, 298, 301; 381/94.5, 381/94.8, 120
  See application file for complete search history.

(56) References Cited

U.S. PATENT DOCUMENTS

| | | | |
|---|---|---|---|
| 4,322,770 A | 3/1982 | Sendelweck | |
| 5,126,637 A | 6/1992 | Watts et al. | |
| 6,107,844 A | 8/2000 | Berg et al. | |
| 6,639,815 B1 | 10/2003 | Guycyski | |
| 6,683,494 B2 * | 1/2004 | Stanley | 330/207 A |
| 6,737,713 B2 | 5/2004 | Georgescu et al. | |
| 7,076,070 B2 * | 7/2006 | Pearce et al. | 381/120 |
| 2008/0043391 A1 | 2/2008 | Wong et al. | |

OTHER PUBLICATIONS

TA5132 Datasheet, Texas Instruments, 2006.
LM 4673 Datasheet, National Semiconductor, Apr. 2006.

* cited by examiner

*Primary Examiner*—Khanh V Nguyen
(74) *Attorney, Agent, or Firm*—Andrew M. Harris; Mitch Harris, Atty at Law, LLC

(57) ABSTRACT

A thermal overload protection circuit and method for protecting switching power amplifier circuits provides protection against latch-up and other failures due to energy returned from an inductive load when the amplifier output is disabled in response to a thermal overload condition. Upon detection of a thermal overload condition, rather than immediately disabling the switching power output stage, the switching power output stage is driven toward a fifty-percent duty cycle of operation for a predetermined time period so that energy stored in inductance of the load is reduced, preventing back-currents that would otherwise may cause latch-up within the integrated circuit when the switching power output stage is disabled. After the time period has elapsed, the switching power output stage is disabled. Alternatively, the current through the inductive load is measured and the switching power stage is disabled after the magnitude of the current has fallen below a threshold.

22 Claims, 6 Drawing Sheets

THERMAL OVERLOAD PROTECTION CIRCUIT AND METHOD FOR PROTECTING SWITCHING POWER AMPLIFIER CIRCUITS

CROSS-REFERENCE TO RELATED PATENT APPLICATIONS

The present U.S. Patent Application is related to U.S. patent application Ser. No. 11/862,324 entitled "PROTECTION CIRCUIT AND METHOD FOR PROTECTING SWITCHING POWER AMPLIFIER CIRCUITS DURING RESET", filed concurrently herewith, and to U.S. patent application Ser. No. 11/862,481 entitled "OVER-CURRENT PROTECTION CIRCUIT AND METHOD FOR PROTECTING SWITCHING POWER AMPLIFIER CIRCUITS" also filed concurrently herewith. Both of the above-referenced U.S. Patent Applications are incorporated herein by reference, have at least one common inventor, and are assigned to the same Assignee.

BACKGROUND OF THE INVENTION

1. Field of the Invention

The present invention relates generally to integrated circuit switching power amplifiers, and more specifically, to a circuit and method for protecting against latch-up failures when a switching power amplifier output stage is disabled in response to detection of a thermal overload.

2. Background of the Invention

Switching power amplifiers are currently in widespread use in automotive amplifiers and other audio amplifiers. Such amplifiers, sometimes referred to as Class D amplifiers, have higher efficiency than linear amplifiers, making them well suited for battery driven applications and applications where power dissipation in the form of heat is a problem, such as very high power professional audio applications, as in concert halls.

The outputs of switching power amplifiers are typically provided to an inductive load, which typically includes a filter inductor through which the output(s) is series-connected to a filter capacitor that is connected in parallel with the load, which may also be highly inductive, such as a loudspeaker. When overheating occurs in the amplifier circuits, the control logic that provides the switching power drive to the output is typically isolated by turning off the drive transistors that switch power to the output terminal(s). However, since the load (including output filtering components) is typically inductive, energy is stored in the inductance of the load and a back-current will occur when the drive transistors are turned off.

When the output driver transistors are integrated on a common substrate, the back-current injects minority carriers through a junction between the output terminal of one of the transistor and the adjoining substrate or well. For example, in a P-type substrate integrated circuit, a current drawn from the output terminal will cause minority carrier injection into the substrate through the drain terminal of the N-channel device that is connected to the output terminal if the potential of the output is sufficiently below the substrate potential so that the PN junction between the substrate and the drain terminal of the N-channel device turns on. Simultaneously, the substrate may have other PN junctions with N-type diffusions of other devices integrated on the substrate, which effectively form bipolar transistors having a collector at each N-type diffusion on the substrate, the substrate as a base, and the drain terminal of the N-channel output device as an emitter. Therefore, minority carrier injection into the substrate is undesirable in that other devices may be turned on or disrupt the operation of another circuit, for example, changing the state of a stored logical value. In the power output stage, the minority carriers in one device can cause a control change in the complementary device that through feedback turns both parasitic devices on, causing latch-up and failure of the integrated circuit. Alternatively or at the same time, when the injected current is much larger (on the order of $10^3$ or $10^6$) than the nominal current of another high current gain device forming a complementary parasitic transistor with the substrate, then the complementary parasitic transistor can provide an over-current path to cause latch-up and failure of the integrated circuit.

Similarly, a current injected into the output terminal will cause minority carrier injection into the N-well that isolates the drain and source of the P-channel device from the substrate, if the potential of the output terminal is sufficiently above the N-well potential so that the PN junction between the N-well and the drain terminal of the P-channel device turns on. Additionally, the N-well has a PN junction with the substrate, which effectively forms bipolar transistors having collectors at the substrate and each P-type diffusion within the substrate, the N-well as a base, and the drain terminal of the P-channel output device as an emitter. Therefore, minority carrier injection into the N-well is undesirable in that other devices may be turned on, or disrupt the operation of another circuit. In the power output stage, the minority carriers in one device can cause a control change in the complementary device that through feedback turns both parasitic devices on, causing latch-up and failure of the integrated circuit. Alternatively or at the same time, when the injected current is much larger (on the order of $10^3$ or $10^6$) than the nominal current of another high current gain device forming a complementary parasitic transistor with the substrate, then the complementary parasitic transistor can provide an over-current path to cause latch-up and failure of the integrated circuit.

Therefore, when driving an inductive load, techniques such as floating substrates and guard rings as described in: "Substrate Connection in an Integrated Power Circuit", U.S. Pat. No. 6,737,713, to Georgescu, et al., have been employed to protect against latch-up and disruption or failure of other components such as digital logic that provides control of the switching output stages, which can potentially cause other devices in the integrated circuit to latch-up. However, if there is sufficient energy stored in the inductive load, the protection of the guard rings can be overcome. Even in applications in which power switching transistors are provided external to a switching power amplifier integrated circuit, if the transistors are fabricated as a monolithic element on a common substrate, latch-up can occur in the switching output stage. Further, such guard rings are applicable only in applications in which the power devices are integrated on the same substrate with the guard rings, and therefore will not provide protection for circuits having separate monolithic driver devices, unless the guard rings are integrated in the driver device package itself.

Therefore, it would be desirable to provide a method and apparatus for protecting a switching amplifier integrated circuit from latch-up and power supply disruption due to shutdown of the amplifier in response to detection of a thermal overload. It would further be desirable to provide an amplifier integrated circuit that is protected during thermal overload shutdown for both internally-integrated power switching device applications and when external power switching transistors are employed.

SUMMARY OF THE INVENTION

The above stated objective of protecting a switching power amplifier during shutdown in response to a thermal overload is achieved in a switching power amplifier integrated circuit and method of operation.

The switching power amplifier integrated circuit includes a control circuit that has a timer. The timer is activated when a thermal overload indication is received. Until the timer expires, the circuit controlling the switching power stage of the amplifier forces the duty cycle of the switching operation toward a fifty-percent duty cycle, thereby reducing the stored energy in the inductance of a load coupled to the switching power output stage, which may include both filter inductance and any load inductance. After the timer has expired, the switching power stage is disabled. In an alternative embodiment, the timer may be omitted, and the current through the load inductance measured. The switching power stage is disabled after the magnitude of the current has fallen below a predetermined threshold.

The switching power stage may be internal to or external to the integrated circuit, with driver outputs of the integrated circuit connected to the switching power stage. The thermal overload indication may be provided from an internal thermal overload detection circuit or an externally provided thermal overload signal. The temperature detecting element may be internal or external to the integrated circuit, or both internal and external temperature detecting elements may be used in combination.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a circuit and method of operation that discharges stored inductive energy from filter inductors and load inductances coupled to the output of a switching power amplifier prior to disabling the switching power stage in response to detection of a thermal overload condition. The circuit and method thereby prevent latch-up and consequent circuit failure that can be caused by discharge of stored magnetic energy from the inductances into the disabled power stage transistors. The discharging is performed by forcing the duty cycle of the output stage toward a fifty-percent duty cycle for a predetermined time period. The forcing may immediately impose a fifty-percent duty cycle, or there may be a gradual change from the duty cycle at the time of receipt of a thermal overload indication toward the fifty-percent duty cycle level.

It is not required that the duty cycle actually reach fifty-percent for the invention to protect the switching power stage and other components, as the stored magnetic energy may be reduced sufficiently by changing the duty cycle only partially to the fifty-percent duty cycle level. The invention further prevents disruption of operation, including latch-up, of control circuits in the integrated circuit by reducing the amount of stored energy in the inductor at the time the output stage is disabled. Therefore, the invention is also applicable to integrated circuits that provide drive levels to switching power devices external to the integrated circuits.

Figure 1A:
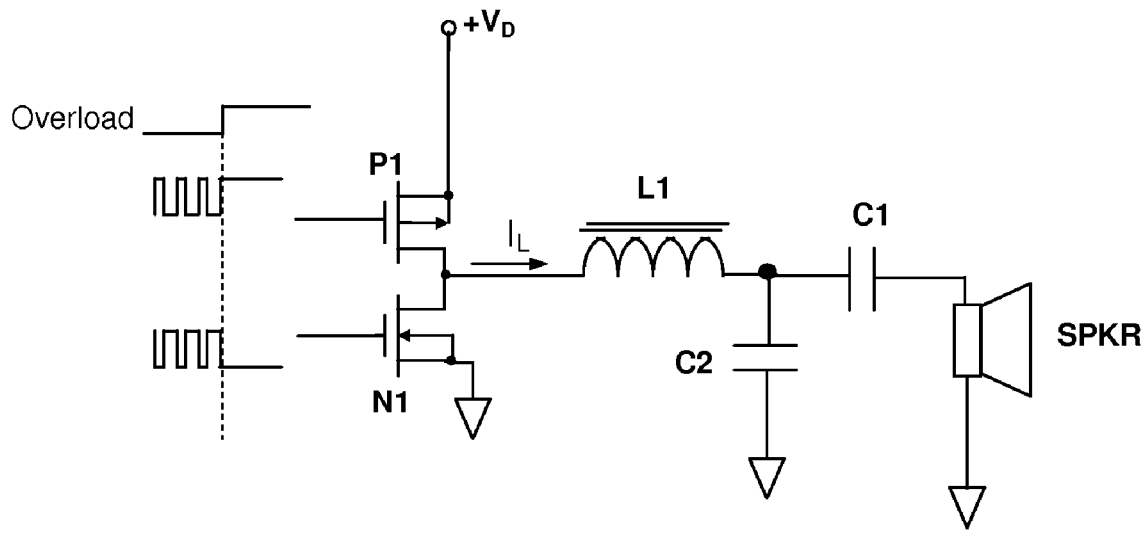
FIG. 1A is a schematic diagram depicting a prior art switching amplifier output stage.
Figure 1B:
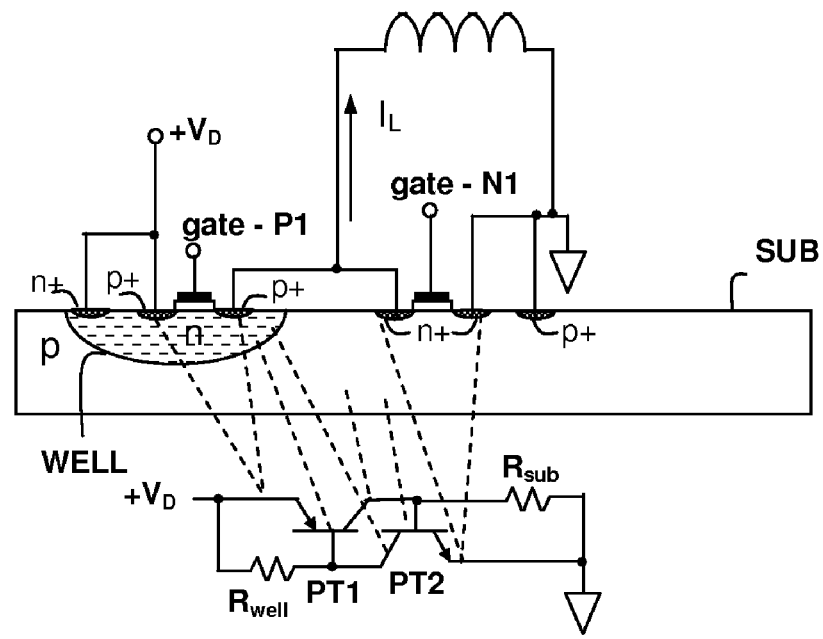
FIG. 1B is a pictorial diagram depicting latch-up mechanism in the prior art switching amplifier output stage of FIG. 1A.

Referring now to the figures, and in particular to FIG. 1A, a prior art CMOS switching amplifier power output stage is shown in the form of a single-ended half-bridge output formed by transistors N1 and P1 that provides a switching pulse-width modulated output signal to an exemplary load, speaker SPKR, through an LC filter comprising inductor L1 and capacitor C2. A coupling capacitor C1 isolates load SPKR from the DC value at the output terminal of converter integrated circuit. In response to a thermal overload signal Overload, transistors P1 and N1 are disabled, causing a current $I_L$ to flow from inductor L1, due to magnetic energy stored in inductor L1, as well as any energy stored in speaker SPKR. FIG. 1B shows the CMOS switching amplifier power output stage of FIG. 1A, fabricated on a substrate SUB. Transistor P1 is fabricated in an N-well WELL in P-substrate SUB, and transistor N1 is formed directly in P-substrate SUB. Substrate SUB is biased to ground through a contact formed by P+ material and well WELL is biased to positive power supply rail $+V_D$ by a contact formed by N+ material.

Due to the fabricated CMOS structure, a parasitic NPN bipolar transistor PT2 is formed between the N+ source and drain terminals of transistor N1, the substrate SUB and the N-well WELL. A parasitic transistor PT1 is formed between the P+ source and drain terminals of transistor P1, the N-well WELL and the P-type substrate SUB. Resistor $R_{well}$ represents the resistance of the material of N-well WELL to positive power supply rail $+V_D$ and resistor $R_{sub}$ represents the resistance of the material of P-type substrate SUB to ground. Under normal operating conditions and due to the bias voltages applied to P-type substrate SUB and N-well WELL, the parasitic bipolar transistors, which are connected back-to-back in a circuit that also resembles an SCR, are in equilibrium. In their equilibrium state, parasitic transistors PT1 and PT2 are off, and the only current flowing through their collectors is a leakage current and the equilibrium state is ensured by the biasing of P-type substrate SUB and N-well WELL.

However, if sufficient disruption occurs in N-well WELL or P-type substrate SUB to cause one of parasitic transistors PT1 and PT2 to start to come on, the feedback connection from the collector of parasitic transistor PT2 to the base of parasitic transistor PT1 and the other feedback connection from the collector of parasitic transistor PT1 to the base of parasitic transistor PT2 will cause both parasitic transistors PT1 and PT2 to conduct, causing latch-up and circuit failure, as any conduction caused in the collector of either parasitic transistor PT1 or PT2 is multiplied by the product of their current gains. As long as the current gain product is greater than unity, the series connection of parasitic transistors PT1 and PT2 will stay saturated, effectively shorting positive power supply rail $+V_D$ to ground through the integrated circuit, causing latch-up failure.

A disturbance sufficient to cause latch-up can be caused by the discharge of stored magnetic energy in inductor L1 and/or speaker SPKR when transistors N1 and P1 are disabled. The current $I_L$ through inductor L1 cannot suddenly change. Thus, when transistors N1 and P1 are disabled in response to a thermal overload condition, if the energy stored in inductor L1 is sufficiently high, parasitic transistor PT2 will turn on (due to the outward direction of current $I_L$) and cause minority carrier injection into the substrate. The activation of parasitic transistor PT2 causes conduction of parasitic transistor PT1, and conduction will directly occur across the power supply provided to transistors N1 and P1, causing failure of the output stage and possibly the power supply circuits. Even if the minority carrier injection is low enough that parasitic transistors PT1 and PT2 are not fully activated, the minority carrier injection into substrate SUB can disrupt other devices formed by N-type diffusions into substrate SUB, including wells that isolate P-channel transistors formed above substrate SUB.

Figure 2:
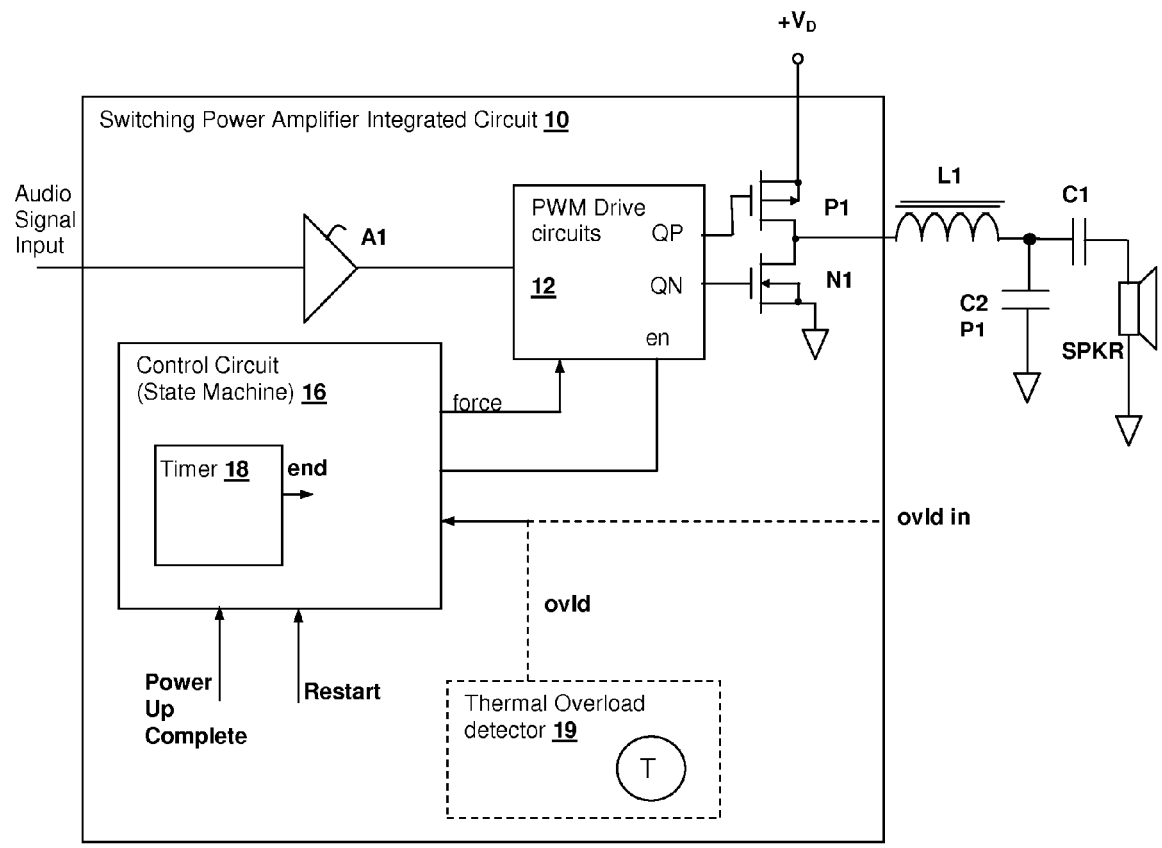
FIG. 2 is a schematic diagram depicting an integrated circuit in accordance with an embodiment of the present invention.

Referring now to FIG. 2, an audio switching power amplifier integrated circuit 10 is shown, in accordance with an embodiment of the present invention. In the depicted embodiment, transistors N1 and P1 are fabricated on the same substrate as control circuits and amplifier circuits that provide functionality within audio switching power amplifier integrated circuit 10. While the embodiments illustrated herein show half-bridge "push-pull" configurations, it is understood that the present invention applies equally to full-bridge configurations and that "push-push" (N-N or P-P) half or full-bridge configurations may also be employed. It is also understood that the applicability of the invention extends beyond CMOS circuits to other technology types such as DMOS and Bipolar-CMOS-DMOS(BCD) technologies. The inductive energy discharging technique may be applied to each half of a full-bridge switch, prior to disabling all of the output devices. The output terminal is coupled to speaker SPKR through the LC filter comprising inductor L1 and capacitor C2 and is DC-isolated by capacitor C1. A pulse width modulator (PWM) drive circuit 12 provides the control (drive) signals that operate transistor P1 and N1 to provide a bi-polar pulsed output at the output terminal of converter integrated circuit 10 that is connected to inductor L1. The filter provided by inductor L1 and capacitor C2 smooth the pulsed signal into the desired AC waveform, which is an amplified replica of the AC input signal being amplified by an amplifier A1 from an input signal audio signal input provided at an input to converter integrated circuit 10. An enable input signal en is provided to PWM drive circuits 12 from a control circuit 16 to enable pulsing from PWM drive circuits 12, thereby disabling transistors N1 and P1 when enable en signal is deactivated. Control circuit 16 is a state machine that includes a timer 18 to time a predetermined period of time corresponding to the discharge period for discharging the stored magnetic energy in the inductive load. Enable signal en is disabled at power-up of integrated circuit 10 and is asserted after an indication by signal Power up complete that initialization is complete, to commence normal switching operation of transistors N1 and P1 to generate an audio output. Enable signal en is asserted during both normal switching operation of integrated circuit 10 and during the energy discharge cycle that is commenced in response to a thermal overload indication. Enable signal en is disabled in response to an end output of timer 18 after completion of the energy discharge cycle, which causes PWM drive circuits 12 to disable transistors N1 and P1 after stored inductive energy has been discharged from the load.

A thermal overload signal ovld provides an indication of thermal overload to audio switching power amplifier integrated circuit 10, that may also be treated as a shutdown signal that disables switching power amplifier integrated circuit 10 completely until a reset indication is received or the power supply voltage is removed and reapplied. Alternatively, audio switching power amplifier integrated circuit 10 may disable the output stage transistors N1 and P1 in response to thermal overload signal ovld and then re-enable output stage transistors N1 and P1 once thermal overload signal ovld indicates that the thermal overload condition has abated. Thermal overload signal ovld is shown as being supplied from an internal thermal overload detector 19 or alternatively a thermal overload input signal supplied from an external thermal overload detection circuit at terminal ovld in. Thermal overload detector 19 includes a temperature sensitive element T and compares its output to a predetermined threshold in order to determine when a thermal overload condition has occurred. Alternatively, an external thermal overload signal and an internal thermal overload signal may be combined in a logical-OR fashion to obtain thermal overload signal ovld.

When thermal overload signal ovld is asserted during normal switching operation of the output stage, there may be a large amount of energy stored in inductor L1 and/or speaker SPKR. Therefore, in order to prevent latch-up, it is desirable to remove the stored energy before disabling both of transistors P1 and N1. Thermal overload signal ovld therefore triggers control circuit 16 to activate timer 18, which times a predetermined period after thermal overload signal ovld is asserted during normal switching operation of the output stage. A signal Restart is provided to control circuit 16, which causes control circuit 16 to enable PWM drive circuits 12 to restart normal operation of integrated circuit 10 after a thermal overload shutdown sequence. Signal Restart may be derived from one or multiple sources, such as a reset input and/or thermal overload signal ovld being in a de-asserted state for a specified time after a thermal overload shutdown has been performed.

In response to thermal overload signal ovld, control circuit 18 asserts a "force" output signal force to PWM drive circuit 12. Output force immediately commands PWM Drive circuit 12 to either immediately produce a fifty percent duty cycle or to gradually reduce the duty cycle from the duty cycle value at the time the force signal was asserted towards and/or to the fifty percent duty cycle level. The fifty percent duty cycle represents the quiescent zero-DC value of the output of switching power amplifier integrated circuit 10, and may be varied from the fifty-percent value as needed to accommodate any asymmetry in output rise time and fall time that might change the quiescent duty cycle value to deviate from fifty percent. Other values of duty cycle could be used, as long as they are close to the quiescent zero-DC value. An end signal end provided by timer 18 indicates the end of the predetermined energy-discharging time period, and when signal end is asserted, control logic 18 de-asserts the enable input en of PWM drive circuits 12, to disable transistors P1 and N1 after the predetermined inductive energy discharge period has elapsed.

Figure 3:
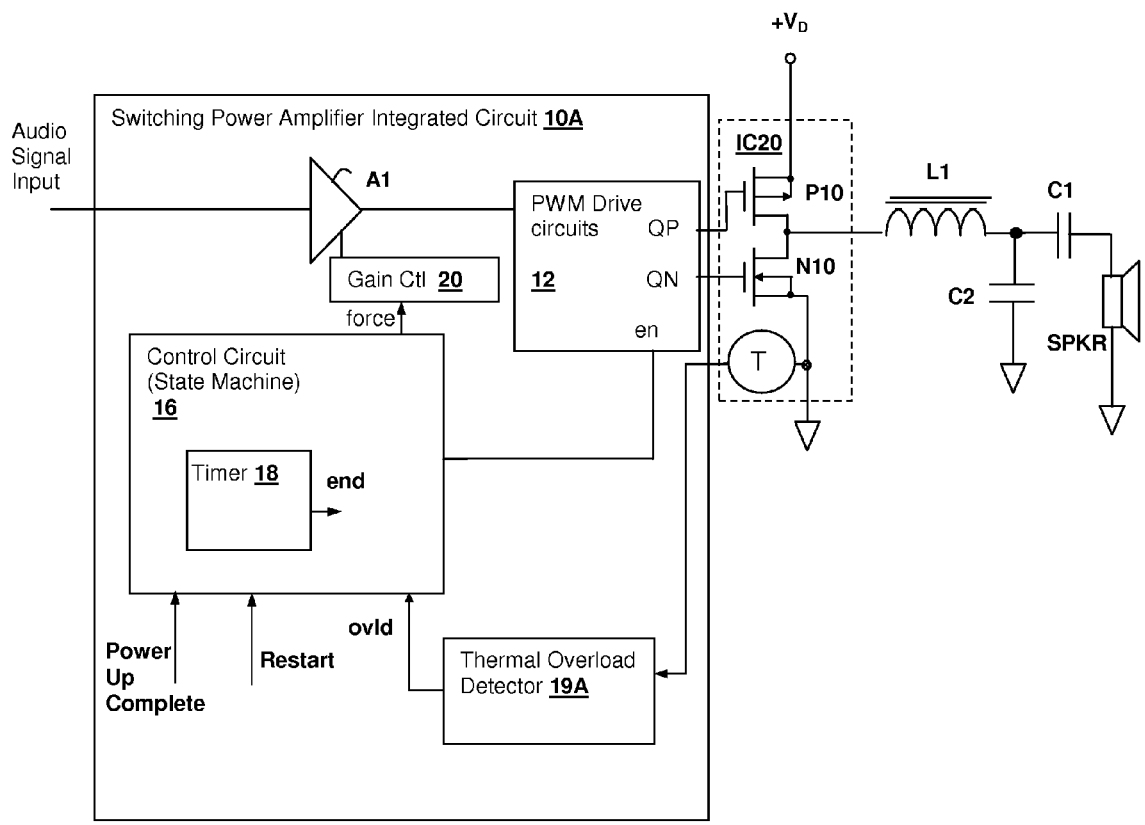
FIG. 3 is a schematic diagram depicting an integrated circuit in accordance with another embodiment of the present invention.

Referring now to FIG. 3, a switching audio power amplifier integrated circuit 10A in accordance with another embodiment of the invention is depicted. The circuit of FIG. 3 is similar to that of FIG. 2, and therefore only differences between them will be described below. There are three primary differences between switching audio power amplifier integrated circuit 10A of FIG. 3 and switching audio power amplifier integrated circuit 10 of FIG. 2. The first difference is that switching audio power amplifier integrated circuit 10A provides drive signals to an external set of power switching transistors N10 and P10, which may be supplied in a monolithic integrated circuit IC20 as shown. If power switching transistors N10 and P10 are fabricated on the same substrate, then the above-described latch-up problem still applies to their operation.

The second difference illustrated in FIG. 3 is an alternative technique for forcing the duty cycle of PWM drive circuits 12 toward the fifty-percent duty cycle level. Rather than control PWM drive circuits 12 directly, control circuit 16 provides signal force to a gain control circuit 20, which can either clamp the amplitude of the audio input signal to zero, resulting in an immediate change to fifty-percent duty cycle after any filtering in the PWM drive circuits, or gradually reduce the audio signal amplitude, resulting in a gradual change toward the fifty-percent duty cycle level. Gain control circuit 20 can be used to control the bias current of amplifier A1, thus controlling the gain of amplifier A1, or alternatively gain control circuit 20 may be a circuit such as a digitally-controlled signal attenuator or feedback attenuator that reduces the signal at the input or output of amplifier A1. The "analog" control technique shown in the present embodiment can be used with internal switching power transistors in an integrated circuit, just as the "direct PWM" control technique depicted in FIG. 2 may be used with external power switching transistors.

The last difference illustrated in FIG. 3 is the location of temperature sensitive element T with respect to thermal overload detector 19. Rather than providing an external logic signal at a terminal ovld in, as shown in FIG. 2 as an optional implementation, temperature sensitive element T provides an input signal to a thermal overload detector 19A, which compares the output of temperature sensitive element T to a threshold, in order to generate thermal overload signal ovld when the internal temperature of monolithic integrated circuit IC20 indicates that a thermal overload condition exists. Alternatively, temperature sensitive element T may be located external to both switching power amplifier integrated circuit 10A and monolithic integrated circuit IC20, for example in an enclosure or on a heatsink coupled to one or both of switching power amplifier integrated circuit 10A and monolithic integrated circuit IC20.

Figure 4:
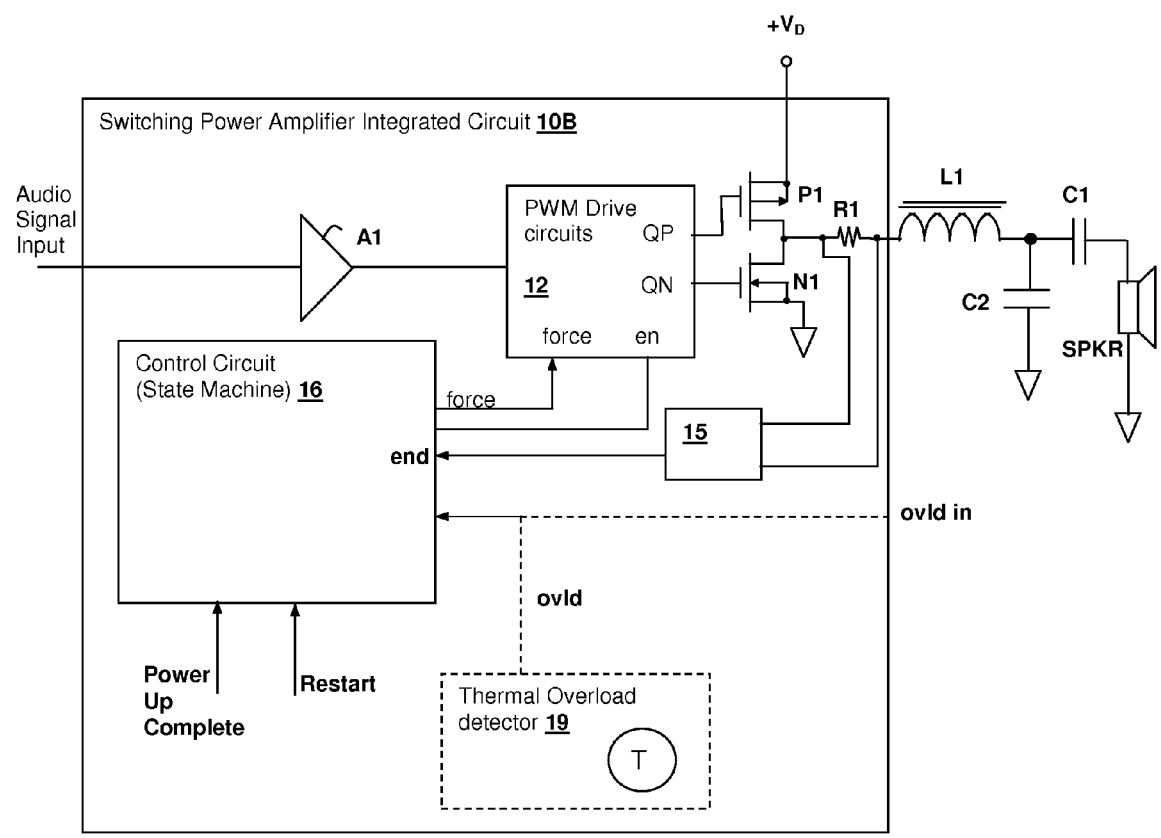
FIG. 4 is a schematic diagram depicting an integrated circuit in accordance with yet another embodiment of the present invention.

Referring now to FIG. 4, a switching audio power amplifier integrated circuit 10B in accordance with another embodiment of the invention is depicted. The circuit of FIG. 4 is similar to that of FIG. 2, and therefore only differences between them will be described below. Integrated circuit 10B includes a current sensing circuit 15 that determines when the magnitude of the current through inductor L1 is within a predetermined window around the zero current level. Signal end is provided from current sensing circuit 15, instead of by a timer 18 as in the embodiments of FIGS. 2-3. Therefore, the operation of PWM drive circuits 12 in response to force signal force will continue until current sensing circuit 15 indicates that most of the energy stored in inductor L1, as well as any other series load inductance has fallen below a level sufficient to ensure that latch-up will not occur.

Figure 5:
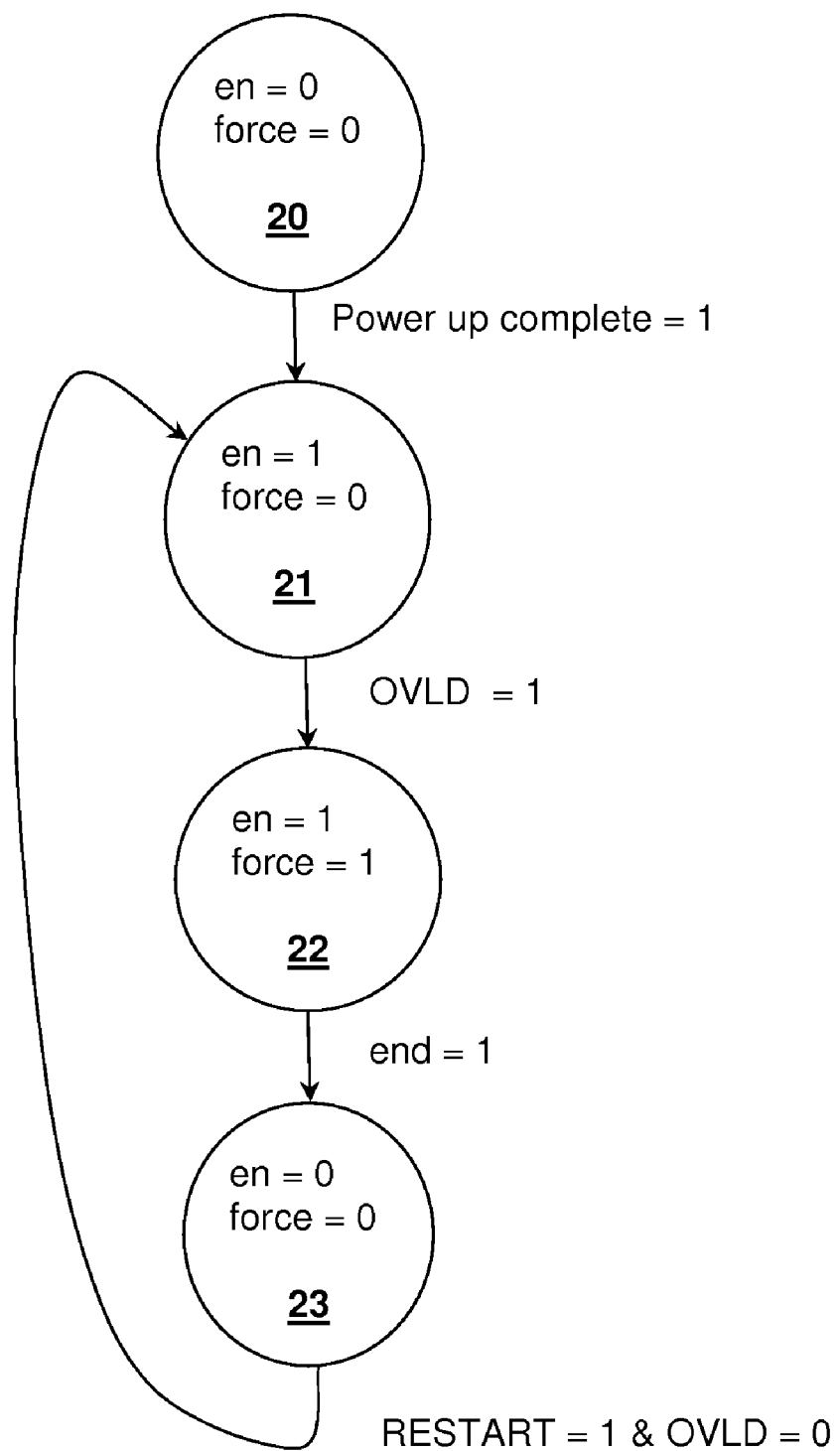
FIG. 5 is a state diagram depicting operation of control circuit 16 within the integrated circuits depicted in FIGS. 2-3.

Referring now to FIG. 5, a state diagram is shown that illustrates operation of control circuit 16 within above-described circuits of FIG. 2 and FIG. 3. At power-up, the state of control circuit 16 begins in a high-impedance state 20, in which signal en is de-asserted and signal force is de-asserted. At completion of the power-up sequence, control circuit 16 transitions to state 21, which is the normal switching state of the output stage during which energy may be stored in the load inductance(s). In state 21, signal en is asserted and signal force is de-asserted. Control circuit 16 will remain in state 21 until thermal overload signal ovld is asserted, or power is cycled, commencing another power-up sequence. When thermal overload signal ovld is asserted, control circuit 16 transitions to state 22, which is the energy reducing state of the output stage. In state 22, signal en remains asserted, and signal force is also asserted. The force signal is asserted for the predetermined time period until the end signal output of timer 18 indicates that the predetermined time period has elapsed. Control circuit 16 then transitions to another high-impedance state 23 until the Restart signal is asserted, and then resumes normal operation in state 21. In state 23, signal en is de-asserted and signal force is de-asserted.

Figure 6:
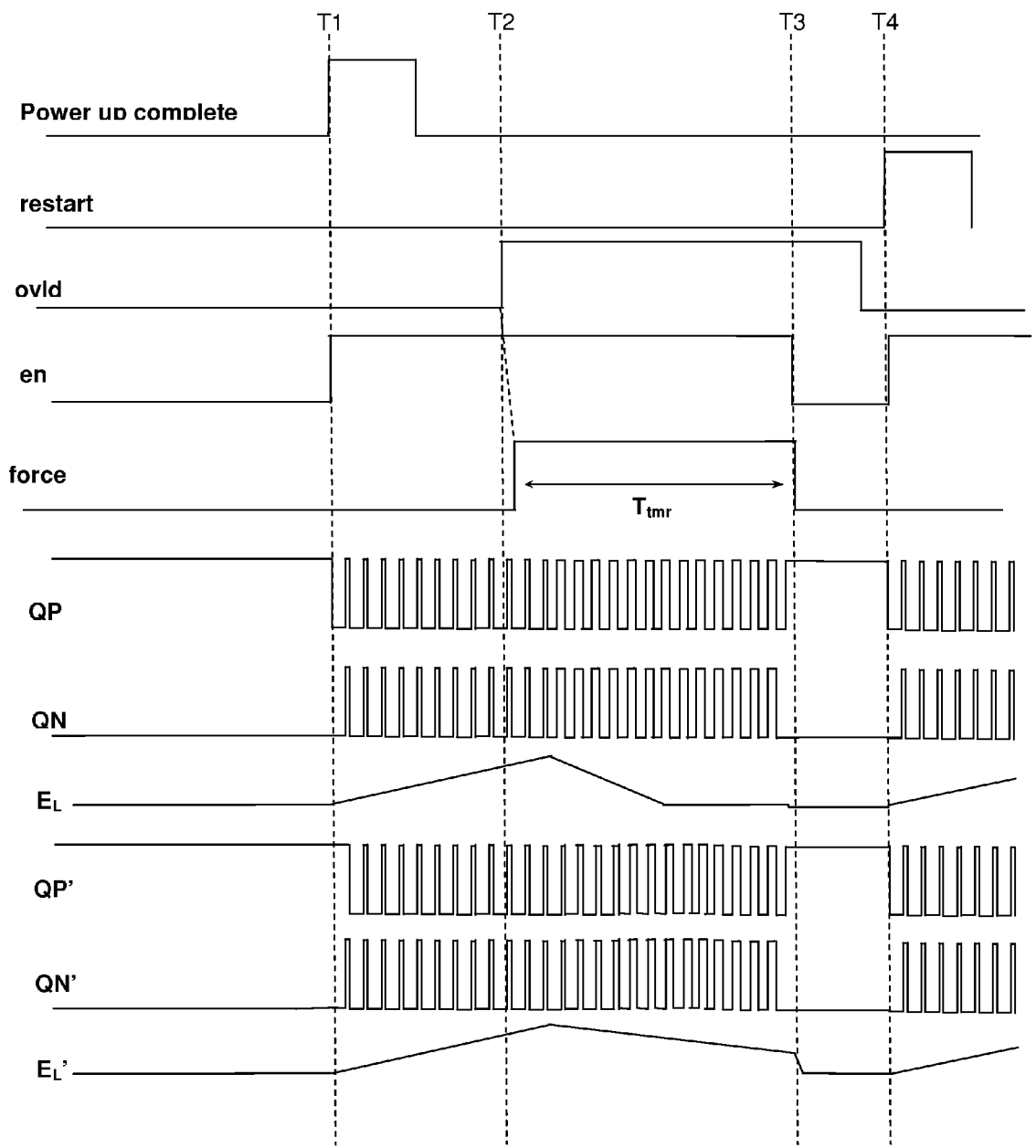
FIG. 6 is a signal waveform diagram depicting signals within the circuits depicted in FIGS. 2-4.

Referring now to FIG. 6, a signal diagram is shown that illustrates operation of the above-described circuits. The left side of FIG. 6 illustrates assertion of signal Power up complete, and the de-assertion of the enable signal en until the power-up initialization sequence is finished. PWM output signals QP and QN are not changing and are set to disable the power switching output transistors. After signal Power up complete is asserted at time T1, the switching power amplifier operates, and generates in the example, an output voltage having a substantially positive value, since output signal QP has an on-time greater than the corresponding off-time, and vice versa for output signal QN. When thermal overload signal ovld is asserted at time T2, the force output of the timer is asserted for a predetermined period $T_{tmr}$. PWM output signals QP and QN are illustrative of immediately forcing the duty cycle to fifty-percent and inductor energy $E_L$ is shown for reference. PWM output signals QP' and QN' are illustrative of gradually forcing the duty cycle toward fifty-percent and inductor energy $E_L'$ is shown for reference. Also illustrated in PWM output signals QN' and QP' is a condition in which the duty cycle never reaches fifty-percent during predetermined period $T_{tmr}$. However, as shown, inductor energy $E_L'$ is still reduced and may be reduced to the level of a single switching cycle energy value at whatever duty cycle is reached, depending on the length of predetermined period $T_{tmr}$ and the rate of reduction of the duty cycle. The changes shown at de-assertion of enable signal en at time T3, which is the end of predetermined period $T_{tmr}$, shows the discharge of the remaining energy in the load inductance through protection and/or parasitic diodes in the switching power output stage. At time T4 signal Restart is asserted, and thermal overload signal ovld has been previously de-asserted. Therefore, normal switching operation resumes.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for protecting circuits within an integrated circuit having an audio amplifier switching driver stage and coupled to an inductive load by power switching devices, the method comprising:

receiving a thermal overload signal indicating that the audio amplifier should be shut down due to a thermal overload;

responsive to receiving the thermal overload signal, activating a timing circuit, by a control circuit during an energy reducing state, for a predetermined expiration period;

during the predetermined expiration period, forcing a duty cycle of the audio amplifier switching driver stage toward a fifty percent duty cycle, whereby energy stored in the inductive load is reduced; and responsive to expiration of the predetermined expiration period, disabling the power switching devices, wherein the power switching devices are not disabled until the energy stored in the inductive load is reduced, whereby latch-up in the circuits due to the energy stored in the inductive load is prevented.

2. The method of claim 1, further comprising providing outputs of the audio amplifier switching driver stage at external terminals of the integrated circuit to control external power switching devices, wherein the disabling is performed by setting states of the outputs of the audio amplifier switching driver stage to disable the external power switching devices.

3. The method of claim 1, wherein the audio amplifier switching driver stage is a power driver stage, and wherein the disabling disables power switching devices of the power driver stage internal to the integrated circuit.

4. The method of claim 1, further comprising generating the thermal overload signal from a temperature detecting circuit internal to the integrated circuit.

5. The method of claim 4, wherein the temperature detecting circuit receives a signal from a temperature sensitive element circuit external to the integrated circuit.

6. The method of claim 1, further comprising receiving the thermal overload signal from a temperature detecting circuit external to the integrated circuit.

7. The method of claim 1, wherein the forcing is performed by operating logic circuits controlling the audio amplifier switching driver stage to force a substantially fifty percent duty cycle.

8. The method of claim 1, wherein the forcing is performed by progressively decreasing an input signal level to the audio amplifier switching driver stage during the predetermined expiration period of the timing circuit.

9. The method of claim 1, wherein the forcing is performed by setting an input signal level to the audio amplifier switching driver stage to zero amplitude.

10. An integrated circuit, comprising:
an audio amplifier switching driver stage having an output connected to the output terminal and controlled by an audio signal;
at least one output terminal for coupling the audio amplifier switching driver stage to an inductive load; and
a control circuit responsive to a thermal overload signal for disabling an audio amplifier switching power stage, wherein the control circuit comprises a timing circuit that is activated in response to the thermal overload signal to time a predetermined time period, wherein the control circuit forces a duty cycle of the audio amplifier switching driver stage toward a fifty percent duty cycle in response to the thermal overload signal to reduce energy stored in the inductive load, wherein the control circuit disables the switching power stage after the predetermined time period has elapsed, wherein the switching power stage is not disabled until the energy stored in the inductive load is reduced, whereby latch-up in the circuits due to the energy stored in the inductive load is prevented.

11. The integrated circuit of claim 10, wherein the audio amplifier switching power stage comprises external power switching devices, wherein the at least one output terminal comprises a pair of terminals for controlling the external power switching devices, and wherein the control circuit disables the external power switching devices by setting states of the outputs of the audio amplifier switching driver stage to disable the external power switching devices.

12. The integrated circuit of claim 10, further comprising internal power switching devices providing the audio amplifier switching power stage, and wherein the at least one output terminal comprises a terminal for connection directly to the inductive load.

13. The integrated circuit of claim 10, further comprising a thermal overload detection circuit for generating the thermal overload indication.

14. The integrated circuit of claim 13, wherein the thermal overload detection circuit comprises a temperature-sensitive element and generates the thermal overload indication in conformity with an output of the temperature-sensitive element.

15. The integrated circuit of claim 13, further comprising a thermal input terminal for receiving a temperature indicating signal from an external temperature-sensitive element, and wherein the thermal overload detection circuit generates the thermal overload indication in conformity with the temperature indicating signal.

16. The integrated circuit of claim 10, further comprising a thermal overload indication input terminal for receiving the thermal overload indication from an external thermal overload detection circuit.

17. The integrated circuit of claim 10, wherein the control circuit forces the duty cycle of the audio amplifier switching driver stage by operating logic circuits controlling the audio amplifier switching driver stage to force a substantially fifty percent duty cycle.

18. The integrated circuit of claim 10, wherein the control circuit forces the duty cycle of the audio amplifier switching driver stage by progressively decreasing an input signal level to the audio amplifier switching driver stage during the predetermined time period.

19. The integrated circuit of claim 10, wherein the control circuit forces the duty cycle of the audio amplifier switching driver stage by setting an input signal level to the audio amplifier switching driver stage to zero amplitude.

20. An integrated circuit, comprising:
an audio amplifier switching power stage having an output connected to the output terminal and controlled by an audio signal;
at least one output terminal for coupling the audio amplifier switching driver stage to an inductive load;
a thermal overload detection circuit for providing a thermal overload indication; and
a control circuit responsive to the thermal overload indication for disabling an audio amplifier switching power stage, wherein in response to the thermal overload indication, the control circuit activates a timer to time a predetermined time period, wherein the control circuit forces a duty cycle of the audio amplifier switching power stage toward a fifty percent duty cycle during the predetermined time period in order to reduce energy stored in the inductive load during the predetermined time period, wherein the control circuit disables the audio amplifier switching power stage after the predetermined time period has elapsed, wherein the audio amplifier switching power stage is not disabled in response to the thermal overload indication until the energy stored in the inductive load is reduced, whereby latch-up in the circuits due to the energy stored in the inductive load is prevented.

21. A method for protecting circuits within an integrated circuit having an audio amplifier switching driver stage and coupled to an inductive load by power switching devices, the method comprising:
- receiving a thermal overload signal indicating that the audio amplifier should be shut down due to a thermal overload;
- responsive to receiving the thermal overload signal, forcing a duty cycle of the audio amplifier switching driver stage toward a fifty percent duty cycle, whereby energy stored in the inductive load is reduced;
- determining whether a magnitude of a current through the inductive load has fallen below a predetermined level; and
- responsive to determining that the magnitude of the current through the inductive load has fallen below the predetermined level, disabling the power switching devices, wherein the power switching devices are not disabled until the energy stored in the inductive load is reduced, whereby latch-up in the circuits due to the energy stored in the inductive load is prevented.

22. An integrated circuit, comprising:
- an audio amplifier switching driver stage having an output connected to the output terminal and controlled by an audio signal;
- at least one output terminal for coupling the audio amplifier switching driver stage to an inductive load;
- a detector for detecting a magnitude of a current through the inductive load; and
- a control circuit responsive to a thermal overload signal for disabling an audio amplifier switching power stage, wherein the control circuit forces a duty cycle of the audio amplifier switching driver stage toward a fifty percent duty cycle in response to the thermal overload signal to reduce energy stored in the inductive load, wherein the control circuit disables the switching power stage after the detector indicates that the magnitude of the current through the inductive load has fallen below a predetermined level, wherein the switching power stage is not disabled until the energy stored in the inductive load is reduced, whereby latch-up in the circuits due to the energy stored in the inductive load is prevented.

* * * * *